United States Patent [19]

Morin

[11] Patent Number: 4,698,584
[45] Date of Patent: Oct. 6, 1987

[54] METHOD AND OHMMETER FOR MEASURING VERY LOW ELECTRIC RESISTANCES

[75] Inventor: Francois Morin, Longueuil, Canada

[73] Assignee: Hydro Quebec, Montreal, Canada

[21] Appl. No.: 790,121

[22] Filed: Oct. 22, 1985

[30] Foreign Application Priority Data

Jun. 25, 1985 [CA] Canada .................................. 485,172

[51] Int. Cl.$^4$ ........................ G01R 27/16; B23K 11/24
[52] U.S. Cl. ....................................... 324/62; 219/110;
219/117.1
[58] Field of Search ..................... 324/62, 64; 219/110,
219/117.1, 109, 108

[56] References Cited

U.S. PATENT DOCUMENTS

| 3,558,849 | 1/1971 | Catherall et al. | 219/110 |
| 4,001,539 | 1/1977 | Franchi et al. | 219/110 |
| 4,104,578 | 0/1978 | Thuot | 324/28 |
| 4,577,086 | 3/1986 | Needham et al. | 324/62 X |

OTHER PUBLICATIONS

Electrical Times, Nov. 16, 1972, R. L. Jackson: "Measuring Contact Resistance Accurately in the Field".
Metal Progress, Mar. 1985, AT&T "It's Steel. But Which Steel?"
Materials Evaluation, Aug. 1983, R. L. Cohen and K. W. West, "Characterization of Metals and Alloys by Electrical Resistivity Measurements", pp. 1074 to 1077.

Funkschau, No. 8, Avril 1981, p. 98, Munich DE; G. Osswald: "Widerstands-Messung mit DVM".

Primary Examiner—Reinhard J. Eisenzopf
Assistant Examiner—Jack B. Harvey
Attorney, Agent, or Firm—Schwartz, Jeffery, Schwaab, Mack, Blumenthal & Evans

[57] ABSTRACT

An ohmmeter for measuring very low electric resistances, for example the very low resistance of a very high current electric joint, which ohmmeter comprises a source for establishing a measuring current through the joint to thereby create a voltage drop proportional to the magnitude of the measuring current and to the resistance to be measured. A first integrator integrates a signal respresentative of the magnitude of the measuring current in order to produce a first integration signal, while a second integrator integrates the voltage drop proportional to the measuring current and to the very low resistance in order to produce a second integration signal. The two integrators are simultaneously reset to zero so that they both start their respective integrations at a same instant. The first integration signal is compared to a reference signal through a comparator. When the amplitude of the first integration signal reaches the amplitude of the reference signal, the comparator delivers a signal which stops the integration carried out by the second integrator. The second integration signal is then stored, this signal having an amplitude constituting a measure of the very low electric resistance. A display device receives the stored integration signal for displaying the value of the measured resistance.

23 Claims, 3 Drawing Figures

METHOD AND OHMMETER FOR MEASURING VERY LOW ELECTRIC RESISTANCES

BACKGROUND OF THE INVENTION

1. Field of the invention:

The present invention relates to an ohmmeter as well as to a method for measuring very low electric resistances.

2. Brief description of the prior art:

The traditional method for measuring electric resistances of 100 μohm, or less is the use of a Kelvin bridge. Such a traditional method allows to measure accurately resistances as low as 0.1 μohm, but has the drawback of necessitating considerable care and technical skill from the operator. Moreover, the method of measuring a very low electric resistance by means of a Kelvin bridge is tedious and time consuming, and therefore is not convenient for an application in which a great number of resistances have to be measured.

Another method, said four-point method, is presently commonly used for the measurement of the very low resistances of the very high current electric joints.

Such a measurement is useful because a too great resistance of a very high current electric joint produces overheating which may cause occurrence of sparks, damage to the electric joint itself, damage to the surrounding equipment, and so on. It is therefore very important to measure this quantity during the installation of very high current equipment as well as during the periodic maintenance periods which usually follow the installation. Moreover, the electrical resistance of these joints is closely related to the mechanical quality of the same. Therefore, the mechanical resistance of a very high current joint can be deduced, to a certain extent, from the measure of the electric resistance of the joint.

According to the four-point method, a constant direct current of about 10 amperes is established through the electric joint, and the voltage drop thereby created across the joint is measured, which voltage drop being proportional both to the very low electric resistance of the joint and to the current through it. As the measured voltage drop has a low amplitude and in order to eliminate the influence of parasitic electromotive forces of thermal origin (thermoelectric effect (thermocouple) caused by the connection of the electrodes used to measure the voltage drop across the joint) on the measurement of the resistance, the direction of the direct current established through the joint is reversed, the voltage drop thereby created across the joint is measured, and the two measured voltage drops corresponding to the two opposite directions of the direct current are averaged in order to obtain a measure of the electric resistance. A drawback of this method is that is requires the establishment of a high, rigorously constant direct current during a relatively long period of time in order to allow an accurate measurement of the very low electric resistance. Consequently, the design of a portable and self-powered apparatus for carrying out into practice such a method must comprise a high current battery, which battery is relatively heavy and therefore renders more laborious the transport of such an apparatus. Moreover, in practice, the current delivered by the battery varies in a non negligible manner and consequently influences the accuracy of the measurement.

Another drawback inherent to the four-point method is that the high direct current established during a relatively long period of time causes heating of the electrodes conducting the direct current and possibly of other elements also conducting this current.

SUMMARY OF THE INVENTION

An object of the present invention is therefore to eliminate the drawbacks of the above-discussed prior art methods by providing an ohmmeter as well as a method for measuring very low electric resistances, which ohmmeter and method are easy to use even for the persons not familiar with this type of measurement, do not require the establishment of a rigorously constant direct current, and allow the measurement of a very low electric resistance within a very short period of time whereby a heavy supply battery is not necessary in the use of a portable ohmmeter.

More particularly, the present invention proposes a method for measuring a very low electric resistance comprising the following steps:

producing a measuring current flowing through an electrically conducting object presenting the very low resistance so as to create a voltage drop proportional both to the magnitude of the measuring current and to the very low electric resistance;

producing a signal representative of the magnitude of the measuring current;

integrating with respect to time and from a same instant the signal representative of the magnitude of the measuring current in order to produce a first integration signal, and the voltage drop proportional to the magnitude of the measuring current and to the very low electric resistance in order to produce a second integration signal;

comparing the first integration signal with a reference signal having a predetermined amplitude; and stopping the integration of the voltage drop proportional to the magnitude of the measuring current and to the very low electric resistance when the comparison of the first integration signal with the reference signal indicates that the first integration signal has reached an amplitude equal to the predetermined amplitude of the reference signal;

the second integration signal having upon stopping of the integration of the voltage drop proportional to the magnitude of the measuring current and to the very low electric resistance an amplitude which constitutes a measure of the very low electric resistance.

The present invention also proposes an ohmmeter for measuring a very low electric resistance, comprising:

a source of electric energy for delivering a measuring current flowing through an electrically conducting object representing the very low resistance so as to create a voltage drop proportional both to the magnitude of the measuring current and to the very low electric resistance;

means for detecting the measuring current and for producing a signal representative of the magnitude of this measuring current;

first integration means for integrating with respect to time the signal representative of the magnitude of the measuring current in order to produce a first integration signal;

second integration means for integrating with respect to time the voltage drop proportional to the magnitude of the measuring current and to the very low electric resistance in order to produce a second integration signal;

means for controlling said first and second integration means so as to simultaneously start the integration of the signal representative of the magnitude of the measuring current carried out by the first integration means and the integration of the voltage drop carried out by the second integration means; and means for comparing the first integration signal with a reference signal having a predetermined amplitude, and for stopping the integration of the voltage drop carried out by the second integration means when the first integration signal reaches an amplitude equal to the predetermined amplitude of the reference signal;

the second integration signal having upon stopping of the integration of the voltage drop carried out by the second integration means an amplitude which constitutes a measure of the very low electric resistance.

The integration of the signal representative of the magnitude of the measuring current and the integration of the voltage drop porportional to the magnitude of the measuring current and to the very low electric resistance allow to perform very rapidly a measurement of the resistance and that with a current which does not need to be constant, whereby a current source using a capacitive discharge may be employed for delivering the measuring current, thereby reducing the weight and volume of the ohmmeter.

BRIEF DESCRIPTION OF THE DRAWINGS

The objects, advantages and other features of the present invention will become more apparent upon reading of the following non restrictive description of a preferred embodiment thereof, given for the purpose of exemplification only with reference to the accompanying drawings, in which.

DETAILED DESCRIPTION OF THE PREFERRED EMBODIMENT

Figure 1:
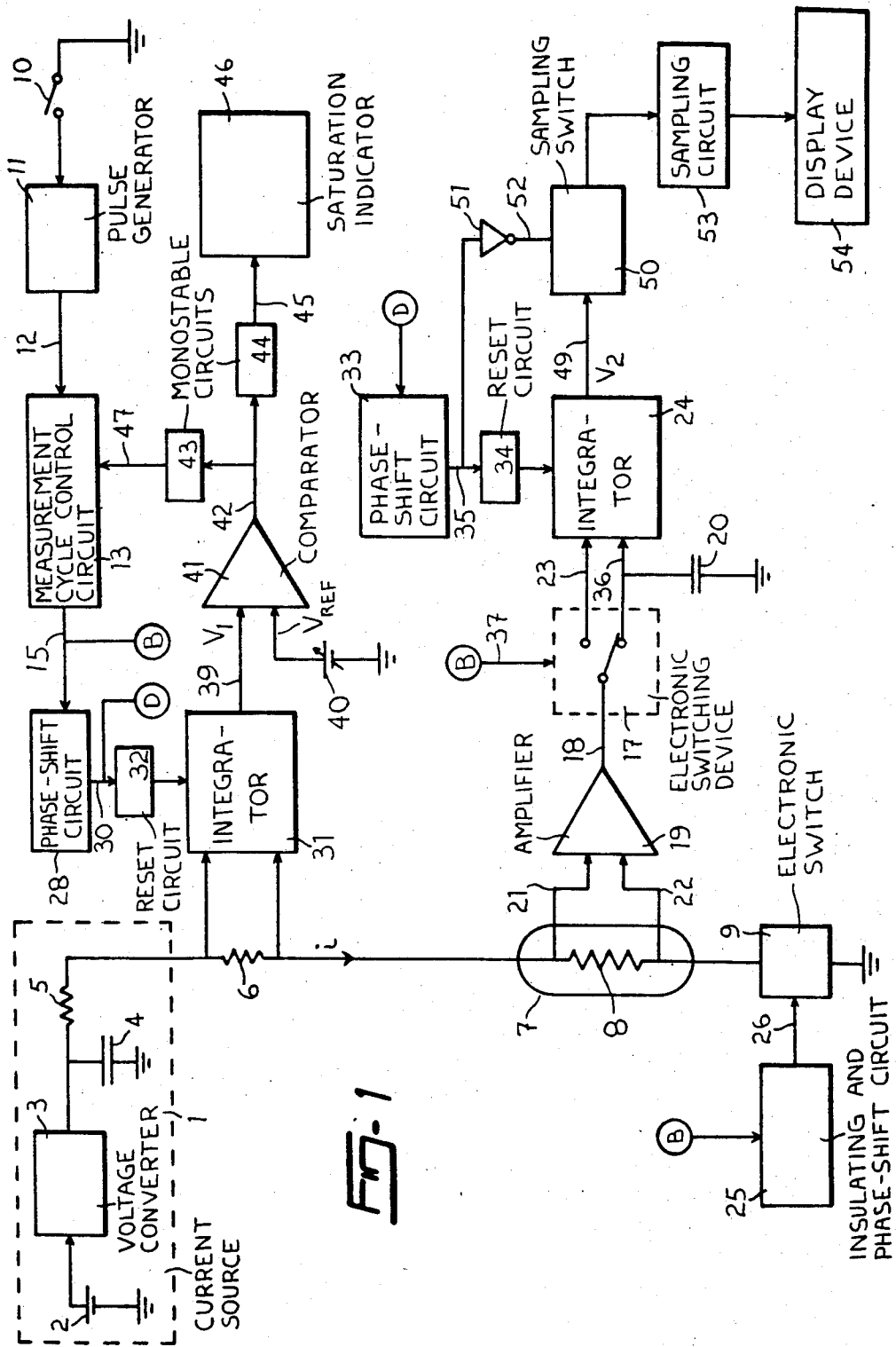
FIG. 1 is a schematic, block diagram of the circuit of an ohmmeter according to the present invention.

As illustrated on FIG. 1 of the drawings, the ohmetter comprises a current source 1 using a capacitive discharge, which source 1 includes a group of batteries 2 easily available on the market, for example 9-volt batteries or C-type batteries. The current source 1 also includes a direct current-direct current (DC-DC) voltage converter 3 designed to elevate the amplitude of the voltage delivered by the batteries 2 to a required level. The relatively high voltage delivered at the output of the converter 3 charges a capacitor 4 having a high capacitance value and which constitutes in fact an accumulator of electric energy. Last of all, the current source 1 using a capacitive discharge comprises a resistor 5 which has a resistance value selected for limiting to a certain level the measuring current i produced through the source 1.

Even if the design of the current source 1 is light and of reduced volume, it can deliver at its output through discharge of the capacitor 4 a pulsed current i having a magnitude of the order of 20 to 30 amperes, which magnitude is of course sufficient for a proper operation of the ohmmeter according to the present invention. The measurement circuit makes possible the use of such a source 1, as it does not require a constant measuring current i and it performs very rapidly the resistance measurement, as will be discussed in more detail hereinafter. It can be appreciated that the light weight and the reduced volume of the current source 1 allows the design of a portable and completely autonomous ohmmeter having reduced weight and volume. Of course, the batteries 2 which charge the capacitor 4 through the converter 3 may also supply the remainder of the circuit of the ohmmeter of FIG. 1.

The measuring current i delivered from the source 1 flows through a shunt resistor 6 provided for producing between its terminals a signal representative of the magnitude of the measuring current i and also through an electrically conducting object 7 presenting the very low electric resistance 8 to be measured, when an electronic switch 9 closes the main loop including the source 1, the resistor 6 and the object 7. It should be noted that when the current i flows through the electrically conducting object 7, a voltage drop proportional both to the very low resistance 8 to be measured and to the measuring current i is produced.

Each measurement cycle carried out by the ohmmeter of FIG. 1 is started through closing of a switch 10, of the push-button type, for thereby connecting to the ground an input of a pulse generator 11. This pulse generator 11 delivers a pulse on its output 12 in response to the closure of the switch 10, this pulse being identified by the reference A on FIG. 2 of the drawings.

The pulse A at the output 12 of the generator 11 is transmitted to a circuit 13 for controlling each measurement cycle. In response to the trailing edge 14 of the pulse A, the control circuit 13 produces a transition high logic level-low logic level 16 of a signal B delivered on its output 15 as illustrated on FIG. 2 of the drawings.

It should be pointed out here that, when the signal B has a high logic level, i.e. before the occurrence of the trailing edge 14 of the pulse A, an electronic switching device 17 receives the signal B on a control input 37 and interconnects the output 18 of a low signal amplifier 19 to a storing capacitor 20. The amplifier 19 comprises two inputs 21 and 22 connected to the object 7 through appropriate electrodes so as to amplify the voltage drop generated by the measuring current i and the very low resistance 8 to be measured. Indeed, it is necessary to amplify this voltage drop due to the low value of the resistance 8 which consequently generates a low voltage drop in response to the current i.

The function of the storing capacitor 20 is to memorize a parasitic electromotive force caused principally by a thermoelectric effect (thermocouple) produced by the contact of the connection electrodes of the two inputs 21 and 22 of the amplifier 19 with the electrically conducting object 7, and secondarily to a drift of the output 18 of this amplifier 19. The storage of this parasitic electromotive force is possible as the measuring current i is established only after the occurrence of the trailing edge 14 of the pulse A as described hereinbelow.

When the signal B has a low logic level after the transition 16, the electronic switching device 17 disconnects the storing capacitor 20 from the output 18 of the amplifier 19 and interconnects this output 18 to an input 23 of an integrator 24.

The signal B is also transmitted to an insulating and phase-shift circuit 25 associated with the electronic switch 9. This circuit 25 produces on its output 26 in response to the signal B a signal C illustrated in FIG. 2 and applied to an input of the switch 9. In response to the transition high logic level - low logic level 16 of the signal B, the insulating and phase-shift circuit 25 produces on its output 26 a transition low logic level - high logic level 27 of the signal C after a short time delay $t_1$ induced, for example, by an optical coupling forming part of the circuit 25 and provided to insulate the electronic switch 9 from the remainder of the circuit of the ohmmeter.

When the signal C has a high logic level after the transition 27, the electronic switch 9 closes the main loop comprising the source 1, the resistor 6 and the object 7 in order to establish the measuring current i through discharge of the capacitor 4.

Figure 2:
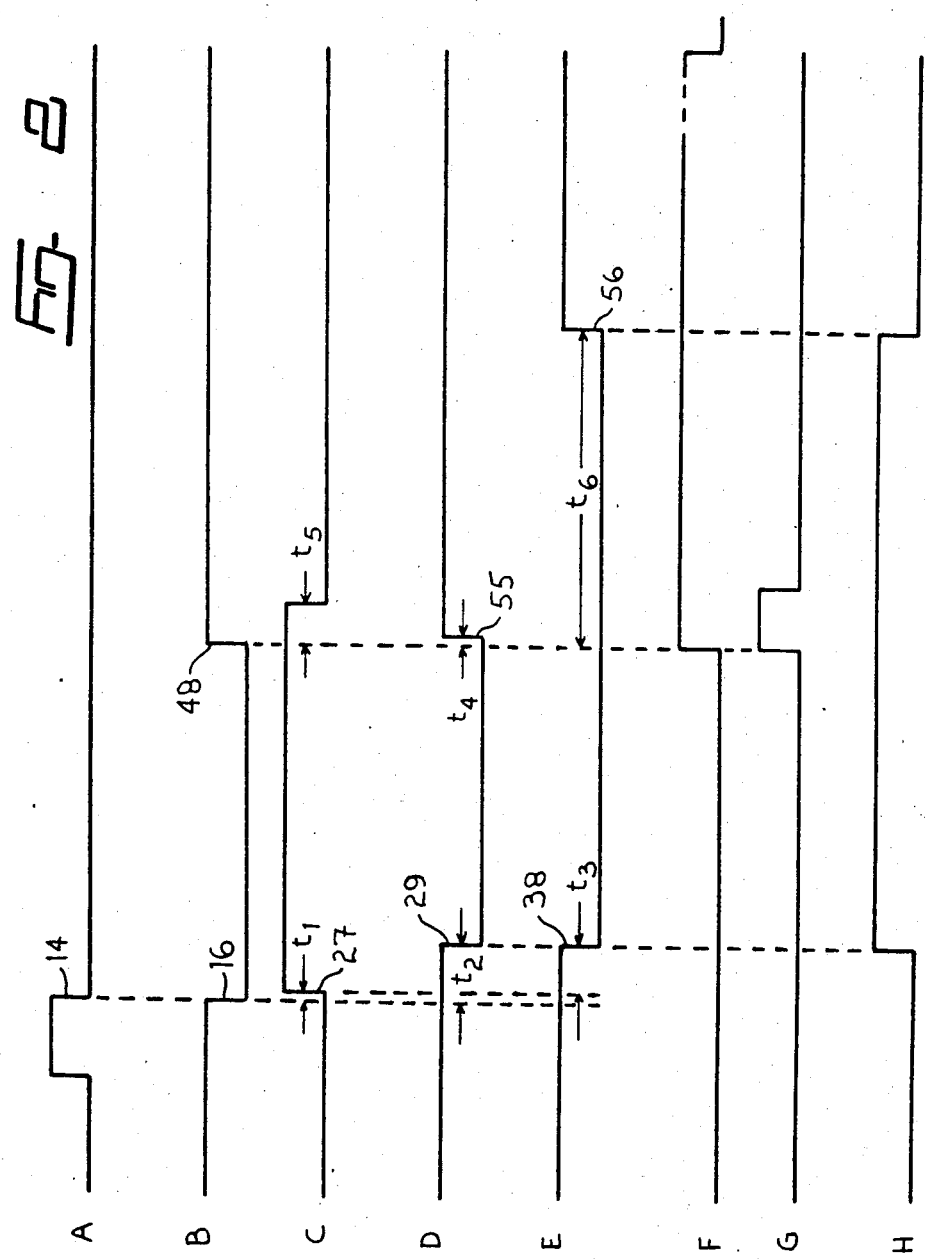
FIG. 2 shows signals illustrating the operation of the ohmmeter of FIG. 1.

In response to the transition 16 of the signal B delivered at the output 15 of the control circuit 13, a phase-shift circuit 28 produces after a time delay $t_2$ a transition high ligic level—low logic level 29 of a signal D illustrated in FIG. 2. The phase - shift circuit 28 delivers the transition 29 of its output 30 so as to start operation of an integrator 31 by deactivating a reset circuit 32. The transition 29 of the signal D is also transmitted without delay through a phase-shift circuit 33 so as to deactivate a reset circuit 34 and thereby starting operation of the integrator 24. The signal applied by the output 35 of the phase-shift circuit 33 to the reset circuit 34 is identified by the letter E in FIG. 2 of the attached drawings.

Consequently, the integration carried out by the integrator 31 and the integration carried out by the integrator 24 are simultaneously started.

Upon resetting to zero the two integrators through the reset circuits 32 and 34, the integrator 31 starts the integration with respect to time of the voltage drop across the resistor 6 which is representative of the magnitude of the measuring current i, while the integrator 24 starts the integration with respect to time of the voltage proportional to the very low resistance 8 and to the measuring current i which is amplified through the amplifier 19. The parasitic electromotive force stored in the capacitor 20 and caused principally by the thermoelectric effect and secondarily by the uncontrolled portion of the voltage shift (slow drift) of the output 18 of the amplfier 19 is applied to an input 36 of the integrator 24, while the voltage drop proportional to the very low resistance 8 and to the magnitude of the measuring current i amplified by the amplifier 19 and to which is added the parasitic electromotive force previously stored in the capacitor 20, is applied to the input 23 of the integrator 24 through the switching device 17. As the integrator 24 integrates the voltage present between its inputs 23 and 36, it integrates only the voltage drop produced by the measuring current i and the electric resistance 8 to be measured, and the parasitic electromotive force caused principally by the thermoelectric effect and secondarily by the slow drift of the output 18 of the amplifier 19 does not influence the integration of this voltage drop proportional to the current i and the resistance 8.

It should be noted that a storing capacitor is not required at the input of the integrator 31 as in this case the parasitic voltage of thermoelectric origin is completely negligible due to the higher resistance value of the resistor 6, and consequently to the higher value of the voltage drop produced across this resistor 6, which voltage drop is integrated through the integrator 31.

Figure 3:
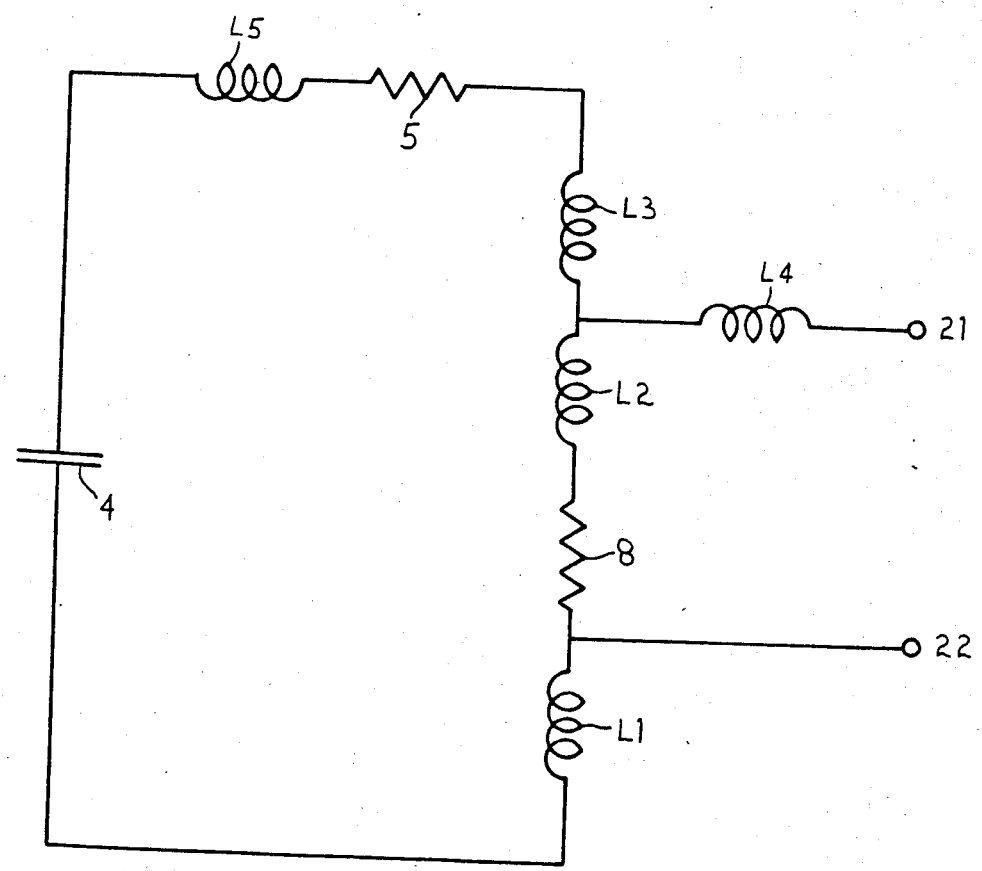
FIG. 3 illustrates a parasitic phenomenon having an inductive origin, which phenomenon occurs during operation of the ohmmeter of FIG. 1

The operation of the ohmmeter must also take into consideration parasitic effects having an inductive origin and which can be produced consequentially to the use of a source of high pulsed current. This induction phenomenon can be more easily understood with reference to FIG. 3 of the drawings which is a simplified representation of the most important components of these effects, neglecting the resistor 6. More particularly, these most important components are the parasitic inductances L1 to L5. Such parasitic effects are explained as follows: the extremely fast switching of the measuring current i produces an important and sudden overvoltages across the object 7 presenting the very low resistance 8. The contribution of the resistor 5 to the total impedance of the circuit is then small and the overvoltage thus comes from the voltage divider corresponding to $$\frac{L2}{(L1 + L2 + L3 + L5)}.$$

In order to eliminate the effect of the parasitic inductances L1 to L5 on the measurement of the very low resistance 8, the pulsed measuring current i is maintained to a reasonable value, of the order of 20 to 30 amperes. The above described phenomenons of parasitic inductance are thereby attenuated, and the voltage drop caused by the resistance 8, being of course low for an electric resistance to be measured of the order of one $\mu$ohm, is sufficient if an appropriate amplifier 19 is used. By introducing a time delay $t_3$ (see FIG. 2) between the establishment of the measuring current i (transition 27 of FIG. 2) and the beginning of the integrations carried out by the integrators 31 and 24 (transitions 29 and 38 of FIG. 2), the effect of the short transients caused by the above described parasitic inductances are, if not completely eliminated, greatly attenuated.

The integrator 31 produces on its output 39 an integration signal $V_1$ which is compared through a comparator 41 with a reference voltage $V_{REF}$ generated by an adjustable voltage source 40. When the integration signal $V_1$ reaches an amplitude equal to that of the reference voltage $V_{REF}$ produced by the source 40, the comparator 41 supplies on its output 42 a signal which activates a reset monostable circuit 43 and a second monostable circuit 44.

The monostable circuit 44 then generates a pulse on its output 45 to supply during a period of time which is sufficiently long a saturation indicator 46 indicating the proper performance of the measurement cycle. The signal delivered by the monostable circuit 44 on its output 45 is identified by the reference F on FIG. 2 of the drawings.

The reset monostable circuit 43 produces on its output 47 a pulse G when the same is activated by the output 42 of the comparator 41, which pulse G is illustrated in FIG. 2 of the drawings. This pulse G is transmitted to the measurement cycle control circuit 13 which produces without delay in response to the leading edge of the pulse G a transition low logic level -high logic level 48 of the signal B delivered on its output 15.

The transition 48 of the signal B controls the electronic switching device 17 to disconnect without delay the output 18 of the amplifier 19 from the input 23 of the integrator 24 so as to stop without delay the integration carried out through this integrator. The integration signal $V_2$ delivered by the integrator 24 on its output 49 then constitutes a measure of the electric resistance 8.

After the transition 48, the output 18 of the amplifier 19 is consequently again connected to the storing capacitor 20, and that until the next measurement cycle is started.

The comparator 41 therefore allows to stop the integration of the voltage drop produced across the electrically conducting object 7 by said very low resistance 8 and the current i after a predetermined quantity of current has passed through this object 7. The use of the comparator 41 has therefore the advantage of automatically establishing the quantity of current required for the measurement of the resistance 8.

As the transition 38 of the signal E supplied on the output 35 of the phase-shift circuit 33 is transmitted to a sampling switch 50 after inversion of this transition through the inverter circuit 51, the switch 50 is closed as soon as the transition 38 of the signal E is produced. The signal at the output 52 of the inverter circuit 51 is identified by the reference H of FIG. 2 of the drawings.

The integration signal $V_2$ retained on the output 49 of the integrator 24 after stopping of the integration carried out by the latter is therefore transmitted to a sampling circuit 53 through the switch 50. The integration signal $V_2$ stored in the sampling circuit 53 after stopping of the integration carried out by the integrator 24 is transmitted to a display device 54 which displays the value of the measured very low electric resistance 8 in response to such a signal.

The measurement cycle performed by the ohmmeter of FIG. 1 is terminated as follows.

The transition 48 of the signal B at the output 15 of the measurement cycle control circuit 13 produces a transition 55 of the signal D at the output of the phase-shift circuit 28 after a time delay $t_4$ (see FIG. 2) introduced by this circuit 28. The transition 55 is therefore applied to the reset circuit 32 of the integrator 31 for thereby stopping operation of this integrator.

The transition 48 of the signal B is also applied to the insulating and phase-shift circuit 25 which opens the electronic switch 9 after a time delay $t_5$ (see FIG. 2) following the occurence of the transition 48. The circuit 25 introduces the time delay $t_5$ in order to prevent disturbances on the measurement of the very low resistance 8 caused by new effects of parasitic inductance produced by the sudden interruption of the measuring current i.

The transition 55 of the signal D delivered on the output 30 of the phase-shift circuit 28 is applied to the phase-shift circuit 33 which produces on its output 35 a transition low logic level - high logic level 56 of the signal E after a time delay $t_6$ following the occurrence of the transition 48. The transition 56 is applied to the reset circuit 34 so as to stop operation of the integrator 24. The transition 56 of the signal E is also transmitted to the sampling switch 50 through the inverter circuit 51 as illustrated on FIG. 2 by the signal H to thereby open the switch 50. It should be noted that the time delay $t_6$ is introduced by the circuits 28 and 33 in order to give enough time to the sampling circuit 53 to store the final value of the integration signal $V_2$ delivered by the integrator 24.

A simple mathematical development will now show how the amplitude of the integration signal $V_2$ constitutes a measure of the very low resistance 8 upon stopping of the integration carried out by the integrator 24.

First of all, the amplitudes of the integration signals $V_1$ and $V_2$ delivered by the integrators 31 and 24, respectively, upon stopping of the integration carried out by the integrator 24, can be expressed as follows:

$$V_1 = V_{REF} = C_1 R_6 I$$

$$V_2 = C_2 R_8 I$$

where $C_1$ is the integration constant of the integrator 31, $C_2$ is the integration constant associated to the integrator 24, $R_6$ is the resistance value of the resistor 6, $R_8$ is the value of the very low resistance 8 to be measured, and I is the result of the integral of the measuring current i within the concerned time period.

By dividing $V_2$ by $V_1$, we obtain:

$$\frac{V_2}{V_1} = \frac{C_2 R_8}{C_1 R_6}$$

as $V_1 = V_{REF}$ the following relationship can be obtained:

$$R_8 = \frac{C_1 R_6}{C_2} \cdot \frac{V_2}{V_{REF}} = C_3 V_2$$

where $C_3$ is a constant equal to $$\frac{C_1 R_6}{C_2 V_{REF}}$$

as $C_1$ and $C_2$ are constants associated to the integrators 31 and 24, respectively, and the resistance value $R_6$ and the voltage $V_{REF}$ are also constants.

The ohmmeter of FIG. 1 can therefore be calibrated by adjusting the integration constant $C_1$, the integration constant $C_2$ and/or the resistance value of the resistor 6, so that the voltage $V_2$ stored by the sampling circuit 53 allows the display device 54 to provide a reading corresponding to the measure of the very low resistance 8. Of course, the calibration of the ohmmeter could also possibly be carried out at least in part through the structure of the display device 54.

In order to vary the range of resistances which can be measured by the ohmmeter, for example for passing from the measurement of resistances of the order of one $\mu$ohm to the measurement of resistances of the order of some tens of $\mu$ohm, one has only to adjust appropriately certain parameters of the ohmmeter such as the resistance value of the resistor 6, the constant $C_1$ of the integrator 31, the gain of the amplifier 19, the integration constant $C_2$, the amplitude of the reference voltage $V_{REF}$, etc. ...

The structure and the operation of the ohmmeter according to the invention are therefore very simple, but permit an accurate measurement of very low electric resistances of a given level, for example of the order of one $\mu$ohm, which level is given through the adjustment of the above-mentioned parameters.

Moreover, the measurement of the electric resistance 8 is completed very rapidly, i.e. within a time delay of the order of some milliseconds, due to the use of the integrators 24 and 31, and of the comparator 41. The measuring current i has therefore only to flow during a very short period of time, whereby any phenomenon of heating caused by this current i is eliminated and the use of a current source using a capacitive discharge is possible.

Some interesting applications of the ohmmeter of FIG. 1 are the following: measurement of the resistance of high current electric joints, non destructive tests on soldered, brazed or welded joints by measurement of the resistance of such joints, measurement of the resistance of the contacts of a circuit breaker, and so on.

In the case of the measurement of the electric resistance of very high current joints, the voltage converter 3 of the current source 1 produces a voltage charging the capacitor 4 which is high enough to subject the electric joint to conditions representative of those to which it is exposed during its utilization.

Although the present invention has been described hereinabove by way of a preferred embodiment thereof, it should be noted that any modification to the ohmmeter or to the method according to the invention, within the scope of the appended claims, is not deemed to change or alter the nature of the subject invention.

What is claimed is:

1. An ohmmeter for measuring a very low electric resistance, comprising:
   a source of electric energy for delivering a one-polarity measuring current flowing through an electrically conducting object presenting said very low resistance so as to create a voltage drop proportional both to the magnitude of the measuring current and to said very low electric resistance;
   means for detecting said measuring current and for producing a signal representative of the magnitude of said measuring current;
   first integration means for integrating with respect to time and from a given instant the signal representative of the magnitude of the measuring current in order to produce a first integration signal representative of the quantity of measuring current which has flowed through the electrically conducting object from said instant;
   means for generating an interruption signal when said first integration signal reaches a predetermined amplitude, that is, when a predetermined quantity of measuring current has flowed through the electrically conducting object from said instant;
   second integration means for integrating with respect to time said voltage drop proportional to the magnitude of the measuring current and to said very low electric resistance in order to produce a second integration signal;
   means for controlling said first and second integration means so as to simultaneously start the integration of the signal representative of the magnitude of the measuring current carried out by the first integration means and the integration of said voltage drop carried out by the second integration means; and
   means for stopping the integration of said voltage drop carried out by the second integration means in response to said interruption signal;
   the second integration signal having upon stopping of the integration of said voltage drop carried out by the second integration means an amplitude which is related to said predetermined quantity of measuring current and which constitutes a measure of said very low electric resistance.

2. An ohmmeter according to claim 1, wherein said source of electric energy is a current source using a capacitive discharge and comprising a capacitor having a high capacitance value, which capacitor delivering said measuring current after having been charged.

3. An ohmmeter according to claim 2, wherein said source of electric energy further comprises at least one battery which supplies a direct current voltage, and means for elevating the direct current voltage supplied by said at least one battery in order to produce a direct current voltage having a higher amplitude for charging said capacitor having a high capacitance value.

4. An ohmmeter according to claim 1, wherein said detecting and producing means comprises a resistor through which flows said measuring current, this resistor producing a voltage drop constituting said signal representative of the magnitude of the measuring current.

5. An ohmmeter according to claim 4, wherein said first integration means comprises an integrator for integrating said voltage drop constituting said signal representative of the magnitude of the measuring current.

6. An ohmmeter according to claim 1, wherein said interruption signal generating means comprises a comparator having a first input receiving the first integration signal, a second input receiving a reference signal having said predetermined amplitude and generated through a voltage source, and an output which delivers said interruption signal when the first integration signal has an amplitude equal to or higher than the predetermined amplitude of said reference signal.

7. An ohmmeter according to claim 6, comprising means for indicating that the first integration signal has an amplitude equal to or higher than the predetermined amplitude of said reference signal in response to said interruption signal.

8. An ohmmeter according to claim 1, wherein said second integration means comprises a circuit for amplifying said voltage drop proportional both to the magnitude of the measuring current and to said very low electric resistance so as to produce an amplified voltage drop, and an integrator for integrating said amplified voltage drop.

9. An ohmmeter for measuring a very low electric resistance, comprising:
   a source of electric energy for delivering a measuring current flowing through an electrically conducting object presenting said very low resistance so as to create a voltage drop proportional both to the magnitude of the measuring current and to said very low electric resistance;
   means for detecting said measuring current and for producing a signal representative of the magnitude of said measuring current;
   first integration means for integrating with respect to time the signal representative of the magnitude of the measuring current in order to produce a first integration signal;
   second integration means for integrating with respect to time said voltage drop proportional to the magnitude of the measuring current and to said very low electric resistance in order to produce a second integration signal;
   means for controlling said first and second integration means so as to simultaneously start the integration of the signal representative of the magnitude of the measuring current carried out by the first integration means and the integration of said voltage drop carried out by the second integration means; and
   means for comparing said first integration signal with a reference signal having a predetermined amplitude, and for stopping the integration of said voltage drop carried out by the second integration means when the first integration signal reaches an amplitude equal to the predetermined amplitude of the reference signal;
   the second integration signal having upon stopping of the integration of said voltage drop carried out by the second integration means an amplitude which constitutes a measure of said very low electric resistance;

wherein said second integration means comprises a circuit for amplifying said voltage drop proportional both to the magnitude of the measuring current and to said very low electric resistance so as to produce an amplified voltage drop and an integrator for integrating said amplified voltage drop; and wherein a parasitic electromotive force due to a thermoelectric effect is produced by connections of said ohmmeter to the electrically conducting object, this parasitic electromotive force being amplified through said amplifying circuit, said second integration means comprising switching means interposed between the amplifying circuit and said integrator which comprises a first input, a second input connected to a capacitor and means for integrating a voltage present between said first and second inputs, the switching means comprising means for transmitting, when the measuring current is not delivered from the source of electric energy, the amplifed parasitic electromotive force to said second input and therefore to the capacitor so that this capacitor stores said amplified parasitic electromotive force, the switching means also comprising means for transmitting, when said measuring current is delivered by the source of electric energy, the amplifed voltage drop to which is added the amplified parasitic electromotive force to the first input of said integrator.

10. An ohmmeter according to claim 8, wherein said second integration means comprises an electronic switching device interposed between the amplifying circuit and said integrator, and wherein said integration stopping means comprises means for controlling said electronic switching device so as to disconnect in response to said interruption signal an output of the amplifying circuit on which is supplied said amplified voltage drop from an input of said integrator for thereby stopping the integration of said amplified voltage drop carried out by said integrator.

11. An ohmmeter for measuring a very low electric resistance, comprising:
  a source of electric energy for delivering a measuring current flowing through an electrically conducting object presenting said very low resistance so as to create a voltage drop proportional both to the magnitude of the measuring current and to said very low electric resistance;
  means for detecting said measuring current and for producing a signal representative of the magnitude of said measuring current;
  first integration means for integrating with respect to time the signal representative of the magnitude of the measuring current in order to produce a first integration signal;
  second integration means for integrating with respect to time said voltage drop proportional to the magnitude of the measuring current and to said very low electric resistance in order to produce a second integration signal;
  means for controlling said first and second integration means so as to simultaneously start the integration of the signal representative of the magnitude of the measuring current carried out by the first integration means and the integration of said voltage drop carried out by the second integration means;
  means for comparing said first integration signal with a reference signal having a predetermined amplitude, and for stopping the integration of said voltage drop carried out by the second integration means when the first integration signal reaches an amplitude means when the predetermined amplitude of the reference signal;
  the second integration signal having upon stopping of the integration of said voltage drop carried out by the second integration means an amplitude which constitutes a measure of said very low electric resistance; and
  means for storing a parasitic electromotive force caused by a thermoelectric effect produced by connections of the ohmeter to said electrically conducting object.

12. An ohmmeter according to claim 11, wherein said second integration means comprises an integrator provided with a first input, with a second input, and with means for integrating a voltage present between said first and second inputs, the stored parasitic electromotive force being applied to said second input while said voltage drop to which is added the parasitic electromotive force is applied to said first input.

13. An ohmmeter according to claim 1, wherein said means for controlling said first and second integration means comprises means for simultaneously resetting to zero said first and second integration means.

14. An ohmmeter according to claim 1, wherein said means for controlling said first and second integration means comprises means for delaying simultaneous starting of the integration carried out by said first integration means and of the integration carried out by said second integration means for a certain period of time following the establishment of the measuring current through said electrically conducting object so as to eliminate at least in part the influence of parasitic phenomenons having an inductive origin on the measurement of said very low electric resistance.

15. An ohmmeter according to claim 1, comprising means for storing the second integration signal after stopping of the integration of said voltage drop carried out by the second integration means.

16. An ohmmeter according to claim 15, comprising a display device for displaying the value of said measured very low electric resistance in response to said second integration signal stored in said storing means.

17. An ohmmeter according to claim 1, wherein said detecting and producing means comprises a resistor through which flows said measuring current, said first integration means comprises a first integrator having a first integration constant, and the second integration means comprises a second integrator having a second integration constant, said ohmmeter being calibrated through adjustment of the resistance value of said resistor of the detecting and producing means, through adjustment of the first integration constant, and/or through adjustment of the second integration constant.

18. An ohmmeter according to claim 1, further comprising means for interrupting the measuring current after a short time delay following stopping of the integration of said voltage drop carried out by said second integration means.

19. An ohmmeter according to claim 1, comprising means for establishing the measuring current delivered by the source of electric energy only during a short period of time for thereby preventing any heating phenomenon caused by the measuring current.

20. An ohmmeter according to claim 1, wherein said electrically conducting object is a high current electric joint, and wherein said source of electric energy comprises means for producing a voltage high enough for subjecting the electric joint to conditions representative of those to which it is subjected during its utilization.

21. A method for measuring a very low electric resistance comprising the following steps:
producing a one-polarity measuring current flowing through an electrically conducting object presenting said very low resistance so as to create a voltage drop proportional both to the magnitude of the measuring current and to said very low electric resistance;
producing a signal representative of the magnitude of said measuring current;
integrating with respect to time and from a same instant the signal representative of the magnitude of said measuring current in order to produce a first integration signal representative of the quantity of measuring current which has flowed through the electrically conducting object from said instant, and said voltage drop proportional to the magnitude of the measuring current and to said very low electric resistance in order to produce a second integration signal;
generating an interruption signal when said first integration signal reaches a predetermined amplitude, that is, when a predetermined quantity of measuring current has flowed through the electrically conducting object from said instant; and
stopping the integration of the voltage drop proportional to the magnitude of the measuring current and to said very low electric resistance in response to said interruption signal;
the second integration signal having upon stopping of the integration of said voltage drop proportional to the magnitude of the measuring current and to said very low electric resistance an amplitude which is related to said predetermined quantity of measuring current and which constitutes a measure of said very low electric resistance.

22. The measuring method of claim 21, further comprising the step of storing the second integration signal present upon stopping of the integration of said voltage drop proportional to the magnitude of the measuring current and to said very low electric resistance.

23. The measuring method of claim 22, further comprising the step of displaying the measure of said very low electric resistance in response to said stored second integration signal.

* * * * *